United States Patent

[11] 3,588,881

[72] Inventor Bernard M. Gordon
Magnolia, Mass.
[21] Appl. No. 843,485
[22] Filed July 22, 1969
[45] Patented June 28, 1971
[73] Assignee Gordon Engineering Company
Wakefield, Mass.

[54] CYCLIC DEVICE FOR ANALOG TO DIGITAL CONVERSION
23 Claims, 4 Drawing Figs.

[52] U.S. Cl. .................... 340/347
[51] Int. Cl. .................... H03k 13/17
[50] Field of Search .................... 340/347; 235/154; 320/1 (X)

[56] References Cited
UNITED STATES PATENTS

| | | | |
|---|---|---|---|
| 3,140,481 | 7/1964 | Hoffman | 340/347 |
| 3,216,002 | 11/1965 | Hoffman | 340/347 |
| 3,251,052 | 5/1966 | Hoffman | 340/347 |
| 3,449,741 | 6/1969 | Egerton, Jr. | 340/347 |

*Primary Examiner*—Maynard R. Wilbur
*Assistant Examiner*—Gary R. Edwards
*Attorney*—Morse, Altman & Oates

ABSTRACT: In a circulating or cyclic device, for converting analog data to digital form, a capacitive transfer technique is provided for accomplishing such conversion. In addition, a capacitive-reference voltage switching technique, particularly for cyclic converters is provided for presenting a bipolar reference switching effect utilizing a unipolar reference.

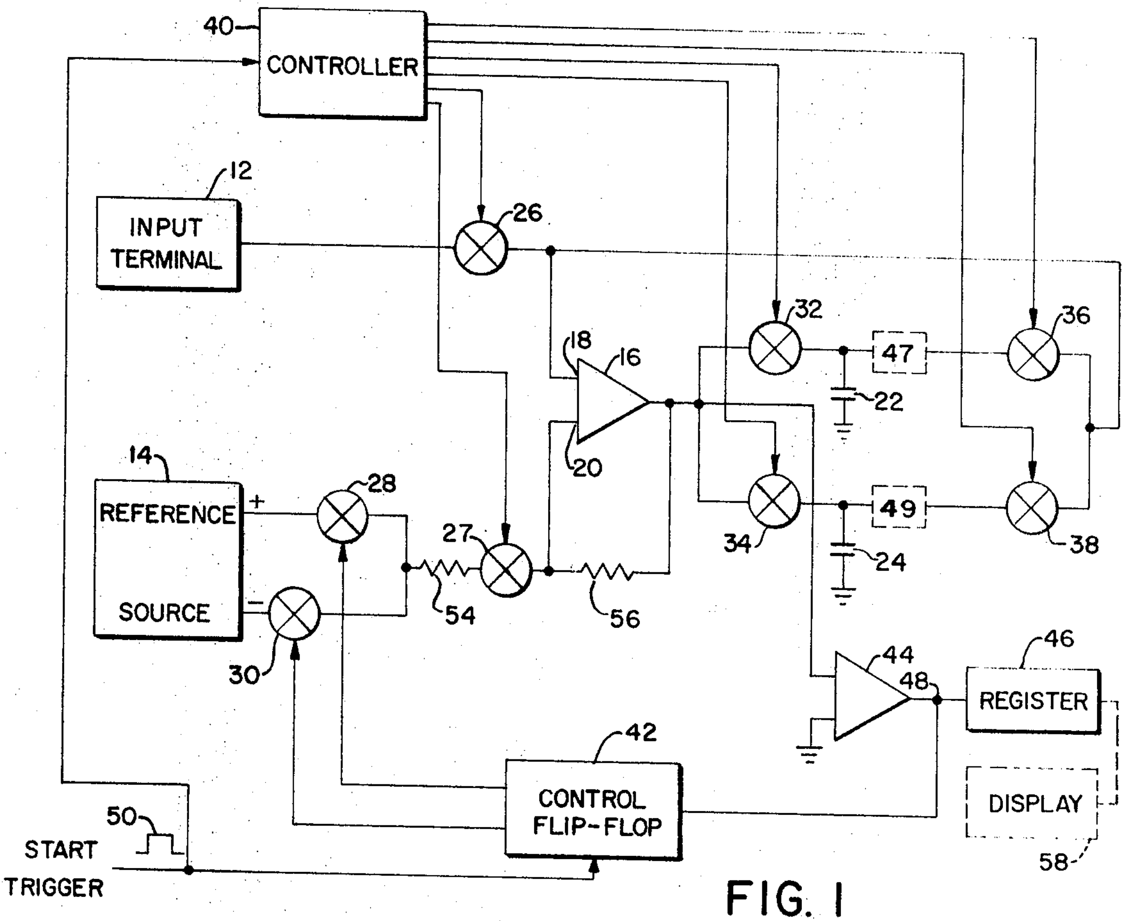
FIG. I
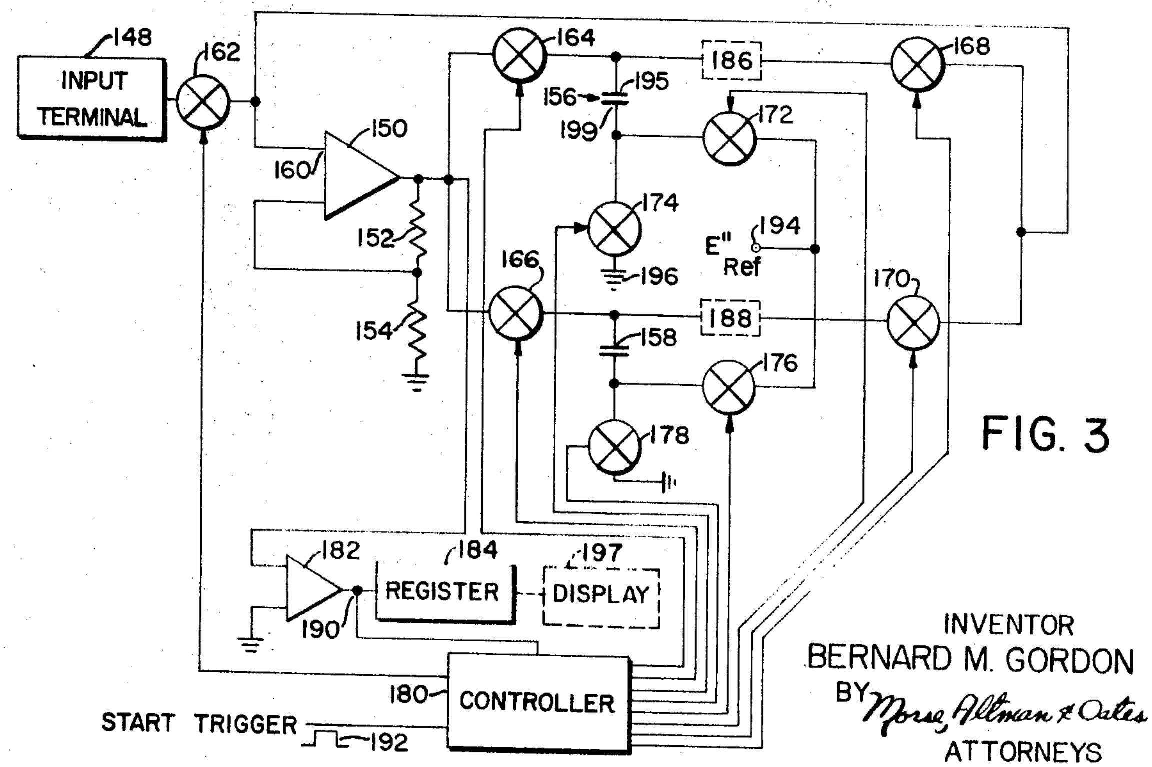
FIG. 3
INVENTOR
BERNARD M. GORDON
BY Morse, Altman & Oates
ATTORNEYS INVENTOR
BERNARD M. GORDON
BY Morse, Altman & Oates
ATTORNEYS INVENTOR
BERNARD M. GORDON
BY Morse, Altman & Oates
ATTORNEYS

CYCLIC DEVICE FOR ANALOG TO DIGITAL CONVERSION

BACKGROUND AND SUMMARY OF THE INVENTION

The present invention relates to data form converters and more particularly to analog-to-digital cyclic converters employing the capacitive transfer technique. In the capacitive transfer technique, data form conversion is accomplished by switching, in a logically programmed sequence, the input and output of an amplifier to a first and a second capacitor. The sequence of switching is such that the amplifier output is connected to the first capacitor when the amplifier input is connected to the second capacitor and the amplifier output is connected to the second capacitor when the amplifier input is connected to the first capacitor. Restoring cyclic converters have suffered from long conversion times as a result of restoring a signal as at the amplifier input to a positive polarity when the previous switching sequence has caused a signal of negative polarity to be presented thereat.

A primary object of the present invention is to provide a nonrestoring cyclic converter characterized by an input terminal for receiving an input signal, a bipolar reference supply for supplying bipolar reference signals, an amplifier having a first and a second input, the input signal is applied to the first input, and the bipolar reference signal is applied to the second input, a pair of capacitors, each alternately receiving a signal from an output of the amplifier and alternately supplying a signal to the first input, a plurality of switching devices for controlling the signals which are applied to each of the inputs and each of the capacitors, a control flip-flop for specifying the state of the switching devices which control the reference signal applied to the second input, a programmer for specifying the state of the switching devices controlling the signals which are applied to the first input and to each of the capacitors; a comparator for controlling the control flip-flop and the programmer, and a register for recording the signal as at the output of the comparator, whereby the recorded signal is the binary form of the input analog signal. The combination of input terminal, bipolar reference supply, amplifier, capacitors, switching device, control flip-flop, comparator, programmer, and register is such as to provide a precise, reliable, and expeditious cyclic converter. Another object of the present invention is to provide a Binary Coded Decimal (BCD) cyclic converter and display characterized by a nonrestoring cyclic converter supplemented with an additional amplifier for providing a BCD signal to a 4-bit shift register, a decoder for decoding the BCD signal stored in the shift register, and a display for presenting the input analog signal in digital form. A further object of the present invention is to provide a capacitive—reference voltage switching technique characterized by a pair of switching devices for controlling a ground signal and a reference signal which are applied to a capacitor. The reference signal is applied to the capacitor through a first of the switching devices and the ground signal is applied to the capacitor through a second of the switching devices in such a manner that a bipolar reference switching effect is provided by a unipolar reference.

The invention accordingly comprises the apparatus possessing the construction, combination of elements, and arrangement of parts that are exemplified in the foregoing detailed disclosure, the scope of which will be indicated in the appended claims.

BRIEF DESCRIPTION OF DRAWINGS

For a fuller understanding of the nature and objects of the present invention, reference should be had to the following detailed description taken in connection with the accompanying drawings wherein:

FIG. 1 is a block and schematic diagram of a nonrestoring binary cyclic analog-to-digital converter embodying the present invention;

FIG. 3 is a block and schematic diagram of a nonrestoring cyclic analog-to-digital converter embodying the capacitive—reference voltage switching technique of the present invention.

DETAILED DESCRIPTION

Figure 2:
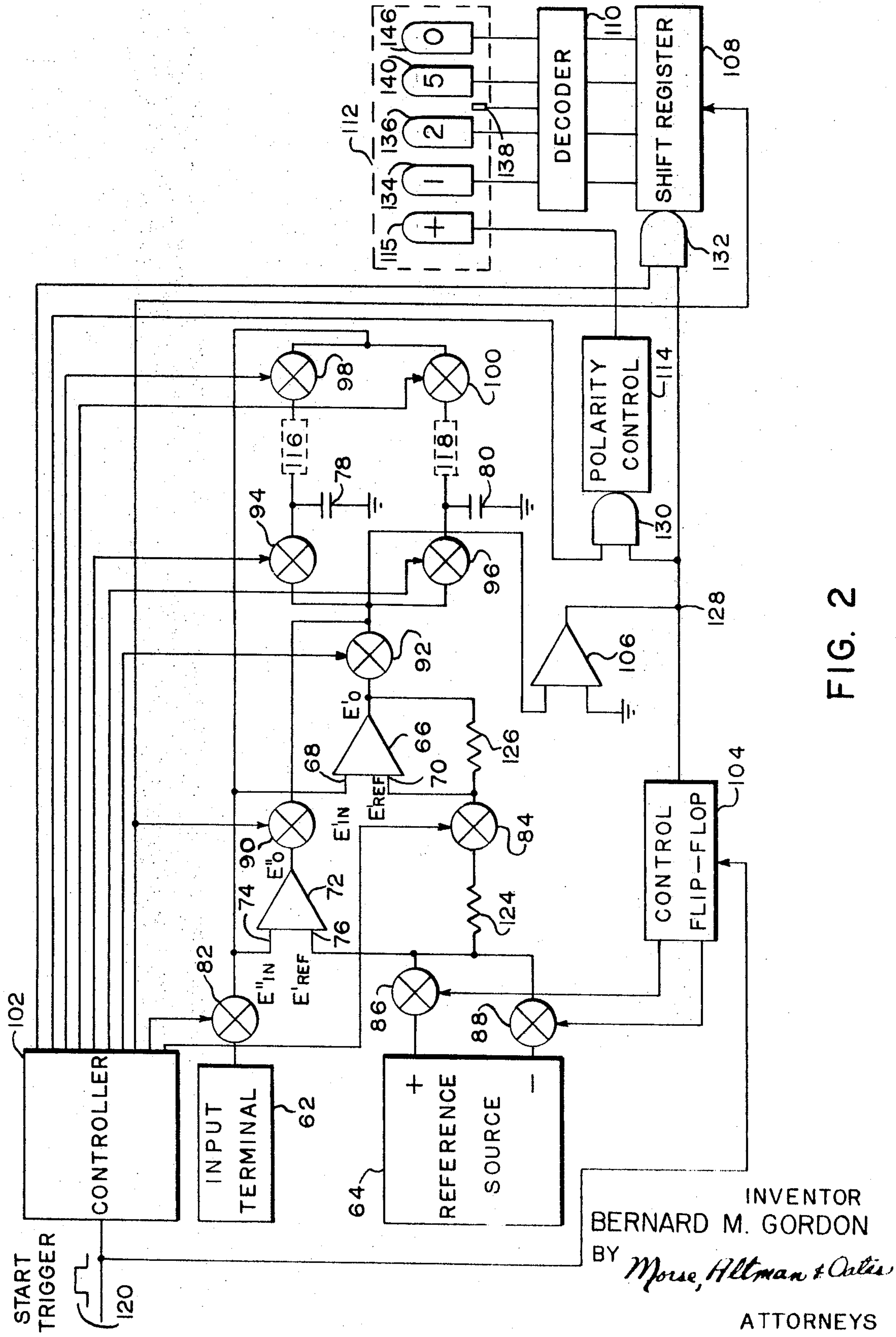
FIG. 2 is a block and schematic diagram of a nonrestoring BCD cyclic analog-to-digital converter embodying the present invention.

Generally, the nonrestoring binary cyclic analog-to-digital converter of FIG. 1 comprises an input terminal 12 for receiving an analog signal, a reference source 14 for supplying bipolar reference signals, an amplifier 16 having a noninverting input 18 and an inverting input 20, a pair of capacitors 22 and 24, each alternately providing an input signal at amplifier 16, a plurality of switching devices 26, 27, 28, 30, 32, 34, 36, and 38 for controlling the signals applied to inputs 18 and 20 and capacitors 22 and 24, a controller 40 for specifying the conduction state of switches 26, 27, 32, 34, 36, and 38, a control flip-flop 42 for controlling the conduction state of switches 28 and 30, a comparator 44 for controlling the state of control flip-flop 42, and a register 46 for recording the analog signal in digital form. In an optional configuration, high impedance, gain of one buffer amplifiers 47 and 49 are provided in order to minimize conversion errors when switches 36 and 38 are turned on. In the following discussion, for convenience, a positive and a zero signal at an output of amplifier 16 produces a ONE at an output 48 of comparator 44 and a negative signal at the output of amplifier 16 produces a ZERO at output 48. The ONE as at 48 causes control flip-flop 42 to be in a state ONE and the ZERO output as at 48 causes the control flip-flop to be in a state ZERO.

In the converter of FIG. 1, conversion is accomplished by a plurality of decisions, the first decision being a determination of the polarity of the analog signal and the remainder being a determination of the magnitude of the analog signal. Conversion is initiated by a start trigger 50, for example, which is applied to controller 40 and control flip-flop 42. Switches 26, and 32 are turned-on and switches 27, 28, 30, 34, 36, and 38 are turned-off. The analog signal as at input terminal 12 is applied to input 18 via switch 26. An output from amplifier 16, which has the same magnitude and polarity of the signal as at 18, is applied to capacitor 22 via switch 32 and a charge is built up on capacitor 22. If the analog signal as at 18 is positive, a ONE is presented at output 48 of comparator 44 and if the analog signal as at 18 is negative, a ZERO is presented at output 48. The signal as at 48, either ONE or ZERO is recorded in register 46 and the first decision is completed. Control flip-flop 42 is triggered into either state ONE or state ZERO by the signal as at 48. If the analog signal as at input terminal 12 is positive the output 48 of comparator 44 is recorded in register 46 for the second through fifth decisions. If the analog signal as at input terminal 12 is negative, the complement of the signal as at 48 is recorded in register 46 for the second through fifth decisions. Zero volts as at the output of amplifier 18 is recorded in register 46 as a ONE. In the second decision, the charge as on capacitor 22 is applied to input 18 of amplifier 16 via switch 36 and the reference voltage is applied to input 20 via switch 27 and either switch 28 or switch 30. If the output as at 48, upon completion of the previous decision, in this case the first decision, is ONE, control flip-flop 42 is in state ONE and switch 28 is turned-on. If the output as at 48 is ZERO, the control flip-flop is in state ZERO and switch 30 is turned-on. A positive reference signal is applied to input 20 via switches 27 and 30, 28 and a negative reference signal is applied to input 20 via switches 27 and 30. Furthermore, in the second decision, switch 34 is turned-on and the signal as at the output of amplifier 16 is applied to capacitor 24. The signal as at the output of 16 also is applied to comparator 44 and either ONE or ZERO is presented at output 48. The ONE or ZERO as at 48 is recorded in register 46 and the second decision is completed. In the third decision, which is operationally analogous to the second decision, the charge on capacitor 24 is applied to input 18 and the output of 16 is applied to capacitor 22. The fourth and fifth decisions are accomplished in a manner similar to the second and third decisions, respectively. For a clearer understanding of the operation of the converter of FIG. 1, reference will be made to a typical conversion. In one example, the analog input as at input terminal 12 is a positive 9 volts, the reference signals are positive and negative 16 volts, and the gain of amplifier 16 is two, i.e., resistors 54 and 56 are of equal ohmic value. The output signal $E_o$ from amplifier 16 is given by the expression $$E_o'=2\left(E_{in}-\frac{E'_{Ref}}{2}\right)$$

where $E_{in}$ is the signal which is applied to input 18 and $E_{Ref}$ is the reference signal which is applied to input 20. As previously stated, capacitor 22 is charged to the analog input voltage $E_{in}$ during the first decision, i.e., positive 9 volts. Upon completion of the first decision, a ONE is stored in register 46 and control flip-flop 42 is in state ONE. When control flip-flop 42 is in state ONE, switch 30 is turned off. In the second decision, switches 27, 28, 34, and 36 are turned-on and switches 26, 30, 32, and 38 are turned-off. The charge on capacitor 22, is applied to input 18 via switch 36 and the positive $E_{Ref}$ is applied to input 20 via switches 27 and 28. The output of amplifier 16 is $$E_o{'}_2=2\left(E'_{in}-\frac{E'_{Ref}}{2}\right)$$

Where $E_{o2}$ is the output of amplifier 16 for the second decision and $E_{in}$ is the signal applied to input 18. The output $E_{o2}$ is applied to capacitor 24 via switch 34 and capacitor 24 is charged to a positive 2 volts. The positive output voltage as at amplifier 16 produces a ONE at output 48 of comparator 44. The ONE as at 48 is stored in register 46 as the most significant bit and also is applied to control flip-flop 42. In the third decision, switches 27, 28, 32, and 38 are turned-on and switches 26, 30, 34, and 36 are turned-off. The positive 2 volt charge on capacitor 24 is applied to input 18 via switch 38 and the positive $E_{Ref}$ is applied to input 20 via switches 27 and 28. The output of amplifier 16 is a negative 12 volts. Capacitor 22 is charged to negative 12 volts via switch 32. The negative output voltage as at amplifier 16 produces a ZERO at output 48 of comparator 44. The ZERO as at 48 is stored in register 46 and also is applied to control flip-flop 42. In the fourth decision, switches 27, 30, 34, and 36 are turned-on and switches 26, 28, 34, and 38 are turned-off. The negative 12 volt charge on capacitor 22 is applied to input 18 via switch 36 and the negative $E_{Ref}$ is applied to input 20 via switches 27 and 30. The output of amplifier 16 is a negative 8 volts and capacitor 24 is charged to a negative 8 volts via switch 34. The negative output as at amplifier 16 produces a ZERO at output 48 of comparator 44. The ZERO as at 48 is stored in register 46 and also is applied to control flip-flop 42. In the fifth decision, switches 27, 30, 32, and 38 are turned-on and switches 26, 28, 34, and 36 are turned-off. The negative 8 volt charge on capacitor 24 is applied to input 18 via switch 38 and the negative $E_{Ref}$ is applied to input 20 via switches 27 and 30. The output of amplifier 16 is zero volts. The zero output as at the output of amplifier 16 produces a ONE at output 48 of comparator 44. The ONE as at 48 is stored in register 46. The signal stored in register 46 during the second through fifth decision, inclusive, is 1001, which is the binary code for nine. In a modified configuration, the signal as in register 46 is applied to a display 58, for example, a numerical indicator, and the input analog signal is presented thereon in digital form. In the illustrated converter of FIG. 1, there are five decisions. It will be understood that, in alternative embodiments, the number of decisions is other than five, for example, six.

FIG. 2 illustrates a nonrestoring BCD cyclic analog-to-digital converter. Generally, the converter of FIG. 2 comprises an input terminal 62 for receiving an analog signal, a reference source 64 for supplying bipolar reference signals, an amplifier 66 having a noninverting input 68 and an inverting input 70, an amplifier 72 having a noninverting input 74 and an inverting input 76, a pair of capacitors 78 and 80 for providing an input signal at noninverting inputs 68 and 74, a plurality of switching devices 82, 84, 85, 86, 88, 90, 92, 94, 96, 98, and 100 for controlling the signals applied to amplifiers 66 and 72 and capacitors 78 and 80, a controller 102 for specifying the conduction state of switches 82, 84, 90, 92, 94, 96, 98, and 100, a control flip-flop 104 for specifying a conduction state of switches 86 and 88, a comparator 106 for controlling a state of control flip-flop 104, a shift register 108 for registering the analog signal in binary code, a decoder 110 for decoding the binary signal in shift register 108, a display 112 for presenting the analog signal in numerical form, and a polarity control 114 for controlling a "+" and "−" indicator 115, for example, in display 112. In an optional configuration, high impedance, gain of one buffer amplifiers 116 and 118 are provided in order to minimize conversion errors when switches 98 and 100 are turned-on.

In the converter of FIG. 2, conversion is accomplished by a plurality of decisions, the first decision being a determination of the polarity of the analog signal and the remainder being a determination of the magnitude of the analog signal. Conversion is initiated by a start trigger 120, for example, which is applied to controller 102 and control flip-flop 104. Switches 82, 92, and 94 are turned-on and switches 84, 86, 88, 90, 96, 98, and 100 are turned-off. The analog signal as at input terminal 62 is applied to input 68 via switch 82. Resistors 124 and 126 are of equal ohmic value and the gain of amplifier 66 is TWO. An output from amplifier 66, which is the same magnitude and polarity of the signal as at 68, is applied to capacitor 78 via switches 92 and 94 and a charge is built-up on capacitor 78. If the analog signal as at 68 is positive, a ONE is presented at output 128 of comparator 106 and if the analog signal as at 68 is negative, a ZERO is presented at output 128. The signal as at 128 and signal from controller 102 are applied to a logic circuit 130. An output from polarity control 114 is applied to "+" and "−" indicator 115 is display 112. If the signal as at 128 is positive, a "+" is presented in display 112 and if the signal as at 128 is negative, a "−" is presented in display 112. If the analog signal as at the output of amplifier 66 is positive upon completion of the first decision, the signal as at output 128 of comparator 106 is recorded in shift register 108 for the second through fifth decisions. When the analog signal as at the output of amplifier 66 is negative upon completion of the first decision, the complement of the signal as at output 128 of comparator 106 is recorded in shift register 108 for the second through fifth decisions. If the output of amplifier 66 is positive upon completion of the sixth decision, the signal as at output 128 is recorded in shift register 108 for the seventh through 10th decisions. When the output of amplifier 66 is negative upon completion of the sixth decision, the complement of the signal as at 128 output is recorded in shift register 108 for the seventh through 10th decisions. Zero volts as at the output of amplifier 66 is recorded in shift register 108 as a ONE. In one example, the analog input as at input terminal 62 is a positive 12½ volts, the reference signals are positive and negative 16 volts, the gain of amplifier 66 is two, and the gain of amplifier 72 is five-eighths. The output signal $E'_o$ of amplifier 66 is given by the expression $$E_o=2\left(E_{in}-\frac{E_{Ref}}{2}\right)$$

Where $E'_{in}$ is the signal applied to input 70 and $E'_{Ref}$ is the reference signal from 64. The output signal $E''_o$ from amplifier 72 is given by the expression $$E''_o=5/8\,(E''_{in}-E'_{Ref})$$

Where $E''_{in}$ is the signal applied to input 74. As previously stated, capacitor 78 is charged to the value of analog input voltage during the first decisions, i.e., positive 12½ volts. Upon completion of the first decision, control flip-flop 104 is in state ONE, there being a positive voltage at 128, switch 86 is turnedion, and switch 88 is turned-off. In the second decision, switches 84, 92, 96, and 98 are turned-on and switches 82, 90, 94, and 100 are turned-off. The charge on capacitor 78, is applied to amplifier 66 via switch 98 and the positive $E'_{Ref}$ is applied to input 70 via switches 84 and 86. The output of amplifier 66 is $$E_{o2}=2\left(E_{in}-\frac{E_{Ref}}{2}\right)$$

Where $E'_{o2}$ is the output of amplifier 66 for the second decision. The output $E'_{o2}$ is applied to capacitor 80 via switch 92 and 96 and capacitor 80 is charged to a positive 9 volts. The positive output as at amplifier 16 produces a ONE at output 128 of comparator 106. The ONE output as at 128 and a signal from controller 102 are applied to a logic circuit 132 and a ONE is stored in shift register 108. The ONE output as at 128 also is applied to control flip-flop 104. In the third decision, switches 84, 86, 92, 94, and 100 are turned-on and switches 82, 88, 90, 96, and 98 are turned-off. The positive 9 volts charge on capacitor 80 is applied to input 68 via switch 100 and the plus $E_{Ref}$ is applied to input 70 via switches 84 and 86. The output of amplifier 66 is a positive 2 volts. Capacitor 78 is charged to positive 2 volts via switches 92 and 94. As in the second decision, a ONE is stored in shift register 108. In the fourth and fifth decisions, the state of the switches 82, 84, 90, 92, 94, 96, 98, and 100 are the same state as in decisions two and three, respectively. In the fourth decision, the output of amplifier 66 is minus 12 volts and in the fifth is minus 8 volts. Upon completion of the fifth decision, 1100 is stored in shift register 108. In the sixth decision, switches 88, 90, 96, and 98 are turned-on and switches 82, 84, 86, 92, 94, and 100 are turned-off. A signal from controller 102 is applied to shift register 108 and the 1100 stored therein is shifted to decoder 110. The transferred signal is decoded and is applied to display devices 134 and 136, for example, numerical indicators. A numeral 1 is presented on numerical indicator 134, a numeral 2 is presented on numerical indicator 136, and a decimal point 138 is presented, by conventional means, between numerical display devices 136 and 140. The minus 8 volt charge on capacitor 78, the output of amplifier 66 during the fifth decision, is applied to input 74 of amplifier 72 via switch 98. The minus 16 volt reference is applied to input 76 of amplifier via switch 88. The output $E''_o$ of amplifier 72 is $$E''_o=5/8\,(E''_{in}-E'_{Ref})$$
$$=+5\text{ volts}$$

The output $E''_o$ is applied to capacitor 80 via switches 90 and 96 and capacitor 80 is charged to a positive 5 volts. Decisions two, three, four, and five are repeated as decisions seven, eight, nine, and 10. Decision six is then repeated as decision 11. Upon completion of decision 11, a numeral five is presented on display device 140, for example, a numerical indicator, and the output from amplifier 72 is zero. Since the output from amplifier 72 is zero, a 0 is presented on display device 146, for example, a numerical indicator. In the illustrated converter of FIG. 2, there are 11 decisions. It will be understood that, in alternative embodiments, the number of decisions is other than 11, for example, 16.

FIG. 3 is a block and schematic diagram of a nonrestoring cyclic analog-to-digital converter and illustrates the capacitive—reference voltage switching technique. Generally, the nonrestoring binary cyclic analog-to-digital converter of FIG. 3 comprises an input terminal 148 for receiving an analog signal, an amplifier 150 having a gain of two i.e. resistors 152 and 154 are of equal ohmic value, a pair of capacitors 156 and 158 for providing an input signal at the noninverting input 160 of amplifier 150, a plurality of switching devices 162, 164, 166, 168, and 170 for controlling the signals applied to input 160 and capacitors 156 and 158, switching devices 172 and 174 for controlling the charge built-up on capacitor 156, switching devices 176 and 178 for controlling the charge built-up on capacitor 158, a controller 180 for specifying the conduction state of switches 162, 164, 166, 168, 170, 172, 174, 176, and 178, and a comparator 182 for providing an input signal to controller 180, and a register 184 for recording the analog signal in digital form. In an optional configuration, high impedance, gain of one buffer amplifiers 186 and 188 are provided in order to minimize conversion errors when switches 168 and 170 are turned-on. In the following discussion, for convenience, a positive and a zero output from amplifier 150 produces a ONE at an output 190 of comparator 182 and a negative output from amplifier 150 produces a ZERO at output 190.

In the converter of FIG. 3, conversion is accomplished by a plurality of decisions, the first decision being a determination of the polarity of the analog signal and the remainder being a determination of the magnitude of the analog signal. Conversion is initiated by a start trigger 192, for example, which is applied to controller 180. Switch 162 is turned-on and switches 164, 166, 168, 170, 172, 174, 176, 178 are turned-off. The analog signal as at input terminal 148 is applied to input 160 via switch 162. A signal as at the output of amplifier 150, which is the same polarity as the input analog signal, is applied to comparator 182. If the analog signal as at 160 is positive, a ONE is presented at output 190 of comparator 182 and if the analog signal as at 160 is negative, a ZERO is presented at output 190. When the analog signal as at input terminal 148 is positive, the signal as at the output 190 of comparator 182 is recorded in register 184 for the second through fifth decisions. If the analog signal as at input terminal 148 is negative, the complement of the signal as at 190 is recorded in register 184 for the second through fifth decisions. Zero volts as at the output of amplifier 150 is recorded in register 184 as a ONE. For convenience, the capacitive switching technique will now be described, particular reference being made to capacitor 156, switches 172 and 174, a ground 196 and a positive reference signal ($E''_{Ref}$). If the output as at 190 is ONE, i.e., a positive signal at the output of amplifier 150, switch 172 is turned-on and switch 174 is turned-off. The positive output of amplifier 150 is applied to capacitor 156 at 195 and the reference signal is applied to the capacitor at 199 via switch 172. The charge built-up on capacitor 156 is the output of amplifier 150 less the reference voltage. If the output as at 190 is negative, i.e., a negative signal at the output of amplifier 150, switch 172 is turned-off and switch 174 is turned-on. The negative output of amplifier 150 is applied to capacitor 156 at 195 and ground 196 is applied to capacitor 156 at 199 via switch 174. At this time, the charge built-up on capacitor 156 is the output of amplifier 150. Switch 172 is turned-on and switch 174 is turned-off. The charge built-up on the capacitor is the output of amplifier 150 plus the reference voltage. Therefore, by controlling the sequence of switching switches 172 and 174, the charge built-up on capacitor 156 is either the amplifier output minus the reference voltage or the amplifier output plus the reference voltage. In one example, the analog input as at input terminal 148 is a positive 9 volts and a positive 16 volt signal, $E''_{Ref}$, is applied to a terminal 194.

In the illustrated example, the charge built-up on capacitor 156, upon completion of the first decision, is positive 2 volts, i.e. positive 18 volts (output of amplifier 150) less the 16 volt reference signal. In the second decision, switches 166, 176, 168, 174, and 176 are turned-on and switches 162, 164, 172, 170, 178 are turned-off. The positive 2 volt charge as on capacitor 156 is applied to input 160 of amplifier 150. The positive 4 volts output from amplifier 150 is applied to comparator 182 and a ONE is presented at 190. Since the signal as at the output of 150 was positive at the completion of the second decision, a ONE is recorded in register 184 as the most significant bit. The positive 4 volt output of amplifier 150 and the positive 16 volt reference signal are applied to capacitor 158 via switches 166 and 176, respectively. Therefore, the charge built-up on capacitor 158 is negative 12 volts. In the third decision, switches 164, 174, 178, and 170 are turned-on and switches 162, 166, 172, 176, and 168 are turned-off. The negative 12 volt charge as on capacitor 156 is applied to input 160. The negative 24 volt output from amplifier 150 is applied to comparator 182 and a ZERO appears at 190. Since the signal as at 190 is ZERO, a ZERO is recorded in register 184. Furthermore, the negative 24 volt output of amplifier 150 and ground 196 are applied to capacitor 156 via switches 164 and 174, respectively. Switch 174 is turned-off and switch 172 is turned-on. The charge built-up on capacitor 156 is a negative 8 volts, i.e. the negative 24 volts output of amplifier 150 plus the positive 16 volt reference signal as at 194. In the fourth decision, switches 166, 168, 174, and 178 are turned-on and switches 162, 164, 170, 172, and 176 are turned-off.

In the fifth decision, switches 164, 170, 174, and 178 are turned-on and switches 162, 166, 168, 172, and 176 are turned-off. The operation of the fourth and fifth decisions, analogous to that of the second and third decisions, causes a ZERO and ONE, respectively, to be presented at output 190 of comparator 182. The signal recorded in register 184 during the second through fifth decisions, inclusive, is 1001, which is the binary code for nine. In a modified configuration, the signal as in register 184 is applied to a display 197, for example, a numerical indicator, and the input analog signal is presented in numerical form.

Figure 4:
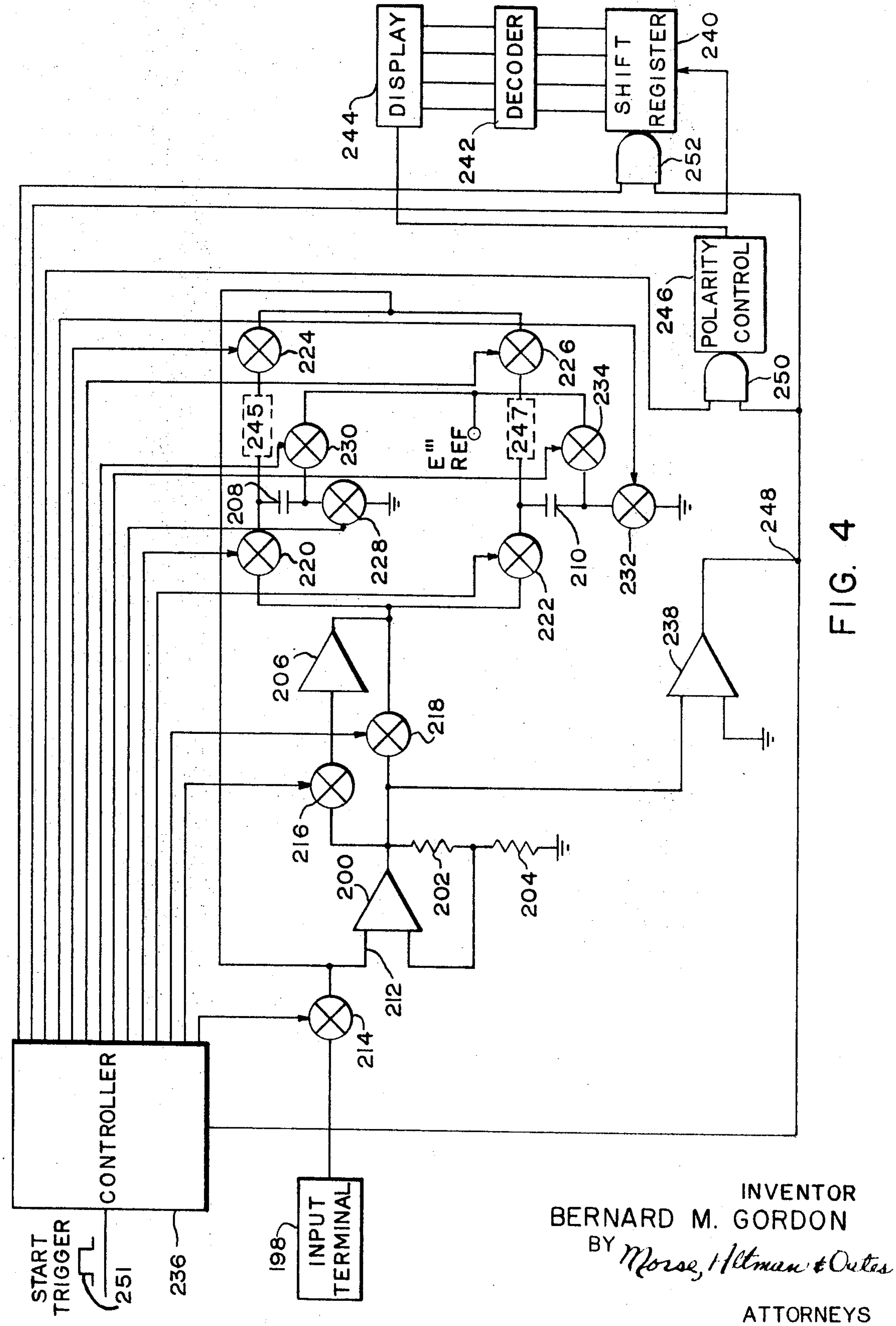
FIG. 4 is a block and schematic diagram of a nonrestoring BCD cyclic analog-to-digital converter embodying the capacitive—reference voltage switching technique of the present invention.

FIG. 4 is a nonrestoring BCD cyclic analog-to-digital converter and illustrates the capacitive—reference voltage switching technique. Generally, the nonrestoring BCD cyclic analog to digital converter of FIG. 3 comprises an input terminal 198 for receiving an analog signal, an amplifier 200 having a gain of two, i.e., resistors 202 and 204 are of equal ohmic value, an amplifier 206 having a gain of five-sixteenths, a pair of capacitors 208 and 210 for providing an input signal at the noninverting input 212 of amplifier 200, a plurality of switching devices 214, 216, 218, 220, 222, 224, and 226 for controlling the signals applied to amplifiers 200 and 206 and capacitors 208 and 210, switching devices 228 and 230 for controlling the charge built-up on capacitor 208, switching devices 232 and 234 for controlling the charge built-up on capacitor 210, a controller 236 for specifying the conduction state of switching devices 214, 216, 218, 220, 222, 224, 226, 228, 230, 232, and 234, a comparator 238 for providing an output terminal signal which represents the polarity of the output signal of amplifier 200, a shift register 240 for recording the analog signal in binary code, a decoder 242 for decoding the binary signal in shift register 240, a display 244 for presenting the analog signal in numerical form, and a polarity control 246 for providing a polarity signal to display 244. In an optional configuration, high impedance, gain of one amplifiers 245 and 247 are provided in order to minimize conversion errors when switches 224 and 226 are turned-on.

In the converter of FIG. 4, conversion is accomplished by a plurality of decisions, the first decision being a determination of the polarity of the analog signal and the remainder being a determination of the magnitude of the analog signal. Conversion is initiated by a start trigger 251, for example, which is applied to controller 236. Switch 214, 218, and 220 are turned-on and switches 216, 222, 224, 226, 228, 230, 232, and 234 are turned-off. The analog signal as at input 198 is applied to noninverting input 212 via switch 214. An output from amplifier 200, which is the same polarity as the input analog signal, is applied to comparator 238. If the analog signal as at 212 is positive, a ONE is presented at an output 248 of comparator 238 and if the analog signal as at 212 is negative, a ZERO is presented at output 248. The signal as at 248 and a signal from controller 236 are applied to a logic circuit 250 at the input of polarity control 246. An output from the polarity control is applied to display 244 and the polarity of the input analog signal is presented on display 244. The signal as at 248 also is applied to controller 236. If the output as at 248 is ONE, switch 230 is turned-on and switch 228 is turned-off. As previously delineated in conjunction with description of the capacitive—reference voltage switching of FIG. 3, the charge built-up on capacitor 208 is the output of amplifier 200 less a reference voltage $E'''_{Ref}$. However, if the output as at 248 is ZERO, switch 228 is turned-on and switch 230 is turned-off. Thereafter, switch 230 is turned-on, switch 228 is turned-off and the capacitor is charged to the output of amplifier 200 plus the reference voltage. The first decision is completed. If the analog signal as at input terminal 198 is positive upon completion of the first decision, the signal as at the output of comparator 238 is recorded in shift register 240 for the second through fifth decisions. When the analog signal as at input 198 is negative upon completion of the first decision, the complement of the signal as at output 248 is recorded in shift register 240 for the second through fifth decisions. If the output of amplifier 200 is positive upon completion of the sixth decision, the signal as at the output of comparator 238 is recorded in shift register 240 for the seventh through 10th decisions. When the output of amplifier 200 is negative upon completion of the sixth decision, the complement of the signal as at output 248 is recorded in shift register 240 for the seventh through 10th decisions. Zero volts as at the output of amplifier 200 is recorded in shift register 240 as a ONE.

In the second decision, switches 218, 222, and 224 are turned-on and switches 214, 216, 220, 226, 232, and 234 are turned-off. The state of switches 228 and 230 is established in the first decision. The charge of capacitor 208 is applied to input 212 of amplifier 200 via switch 224 and the output of amplifier 200 is applied to comparator 238. The output of comparator 238, either ONE or ZERO, and a signal from controller 236 are applied to a logic circuit 252. The ONE or ZERO as at 248 is recorded in shift register 240 as the most significant bit. The signal as at 248 also is applied to controller 236. If the output as at 248 is ONE i.e., a positive output from amplifier 200, switch 234 is turned-on and switch 232 is turned-off. The charge built-up on capacitor 210 is the output of amplifier 200 less the reference voltage $E'''_{Ref}$. However, if the output as at 248 is zero, i.e., a negative output from amplifier 200, switch 232 is turned-on and switch 234 is turned-off. Thereafter, switch 232 is turned-off and switch 234 is turned-off and capacitor 210 is charged to the output of amplifier 200 plus the reference voltage. The second decision is completed. In the third decision, switches 218, 220, and 226 are turned-on and switches 214, 216, 222, 224, 228, and 230 are turned-off. The state of switches 232 and 234 is established in the second decision. The charge of capacitor 210 is applied to input 212 of amplifier 200 via switch 226. The output of amplifier 200 is applied to comparator 238. The output as at 248, either ONE or ZERO, and a signal from controller 236 are applied to logic circuit 252. The ONE or ZERO as at 248 is recorded in shift register 240. The signal as at 248 also is applied to controller 236. Switches 228 and 230 are sequentially turned-on and off in a manner analogous to the switching delineated in the first decision. The description of the operational characteristics of the fourth and fifth decisions are similar to the delineation of the second and third decisions, respectively.

In the sixth decision, switches 216, 222, 224, and 232 are turned-on and switches 214, 218, 220, 226, and 234 are turned-off. The charge built-up on capacitor 208 during the fifth decision is applied to amplifier 200 via switch 224. The output of amplifier 224 is applied to amplifier 206 via switch 216. The output of amplifier 206 is applied to capacitor 210 via switch 222 and charge is built-up on capacitor 210. Furthermore, an output from controller 236 is applied to shift register 240. The recorded outputs of the second, third, fourth, and fifth decisions are shifted to decoder 242 and are decoded. The output signals from decoder 242 are applied to display 244 and are presented therein as a numerical indication of the decoded signal of the second through fifth decisions. Decisions two, three, four, and five are repeated as decisions seven, eight, nine, and 10. Decision six is then repeated as decision 11. In the illustrated converter of FIG. 4, there are 11 decisions, it will be understood that, in alternative embodiments, the number of decisions is other than 11, for example, 16.

Since certain changes may be made in the foregoing disclosure without departing from the scope of the invention herein involved, it is intended that all matter contained in the above description and shown in the accompanying drawings be construed in an illustrative and not in a limiting sense.

I claim:

1. A device for conversion of analog data to digital form, said device comprising:

a. input terminal means for receiving a bipolar analog signal;
b. reference source means for providing at least first and second reference signals;
c. amplifying means including an amplifier means having at least a pair of inputs and at least one output, a first of said inputs being operatively connected to said input terminal means and a second of said inputs being operatively connected to said reference source means;
d. first electrical means including first capacitor means having at least first and second electrodes for storing an output signal from said amplifier means and for providing an input signal to the first input of said amplifier means, said second electrode being connected to ground potential;
e. second electrical means including second capacitor means having at least first and second electrodes, for storing an output signal from said amplifier means and for providing an input signal to the first input of said amplifier means, said second electrode being connected to ground potential;
f. first switch means for connecting the first electrode of said first capacitor means to the first input and output of said amplifier means;
g. second switch means for connecting the first electrode of said second capacitor means to the first input and output of said amplifier means;
h. third switch means for disconnecting the second input of said amplifier means from said reference source means;
i. controller means for actuating said first, second, and third switch means, the first electrode of said first capacitor means is connected to the first input of said amplifier means when the first electrode of said second capacitor means is connected to the output of said amplifier means and the first electrode of said second capacitor means is connected to the first input of said amplifier means when the first electrode of said first capacitor means is connected to the output of said amplifier means, the first electrodes of said first and second capacitor means being sequentially connected to the output of said amplifier means;
j. fourth switch means for selectively connecting said first and second reference signals to said third switch means;
k. control flip-flop means for actuating said fourth switch means, said first reference signal is applied to the second input of said amplifier means when the output signal of said amplifier means is positive and said second reference signal is applied to said second input of said amplifier means when the output signal of said amplifier means is negative;
l. comparator means operatively connected to the output of said amplifier means, the output signals from said comparator means being a function of the polarity of the signal as at the output of said amplifier means; and
m. third electrical means including register means for recording said comparator output signals whereby said recorded signals represent the input signal in digital form.

2. The device of claim 1 wherein:

a. said first electrical means includes also first buffer amplifier means operatively connected between the first electrode of said first capacitor; and
b. said second electrical means includes also second buffer amplifier means operatively connected between the first electrode of said second capacitor means and the first input of said amplifier means.

3. The device of claim 1 wherein said amplifying means includes also:

a. first resistor means serially connected between the second input and output of said amplifier means; and
b. second resistor means operatively connected between the second input of said amplifier means and said reference source means.

4. The device of claim 1 wherein said third electrical means includes also display means for receiving a signal from said register means, whereby said analog signal is presented in digital form by said display means.

5. A device for conversion analog data to digital form, said device comprising:

a. input terminal means for receiving a bipolar analog signal;
b. reference source means for providing at least first and second reference signals;
c. first amplifier means having at least a pair of inputs and at least one output, a first of said pair being operatively connected to said input terminal means and a second of said pair being operatively connected to said reference source means;
d. second amplifier means having at least a pair of inputs and at least one output, a first of said pair being operatively connected to the first input of said first amplifier means, a second of said pair being operatively connected to said reference source means, and said output being operatively connected to the output of said first amplifier means;
e. first electrical means including first capacitor means, having at least first and second electrodes for storing an output signal from said first and second amplifier means and for providing an input signal to the first inputs of said first and second amplifier means, said second electrode being connected to ground potential;
f. second electrical means including second capacitor means, having at least first and second electrodes for, storing an output signal from said first and second amplifier means and for providing an input signal to the first input of said first and second amplifier means, said second electrode being connected to ground potential;
g. first switch means for connecting the first electrode of said first capacitor to the first input and output of said first amplifier means and the first input and output of said second amplifier means;
h. second switch means for connecting the first electrode of said second capacitor to the first input and output of said first amplifier means and the first input and output of said second amplifier means;
i. third switch means for disconnecting the second input of said first amplifier means from said reference source means;
j. controller means for actuating said first, second and third switch means, the first electrode of said first capacitor means is connected to the first input of said first amplifier means when the first electrode of said second capacitor means is connected to the output of said amplifier means, the first electrode of said second capacitor means is connected to the first input of said first amplifier means when the first electrode of said first capacitor means is connected to the output of said first amplifier means, the first electrode of said first capacitor means is connected to the first input of said second amplifier means when the first electrode of said second capacitor means is connected to the output of said second amplifier means, and the first electrode of said second capacitor means is connected to the first input of said second amplifier means when the first electrode of said first capacitor means is connected to the output of said second amplifier means;
k. fourth switch means for connecting said first and second reference signals to said third switch means and the second input of said second amplifier means;
l. control flip-flops means for actuating said fourth switch means, said first reference signal is applied to the second input of said first and second amplifier means when the output signal from said first amplifier means is positive and said second reference signal is applied to the second input of said first and second amplifier means when the output signal from said first amplifier means is negative;

m. third electrical means including comparator means operatively connected to the output of said first amplifier means, the output of signals from said comparator means being a function of the polarity of the signal as at the output of said first amplifier means;

n. shift register means for recording said comparator output signals;

o. decoder means for decoding said comparator output signals recorded in said shift register means; and p. display means for receiving said decoded signal, whereby said analog signal is presented in digital form by said display means.

6. The device of claim 5 wherein said third electrical means includes also polarity means operatively connected to said comparator means and controller means for specifying the polarity of said input analog signal.

7. The device of claim 5 wherein said display means includes a plurality of numerical indicator means, whereby said analog input is presented in numerical form by said display means.

8. The device of claim 5 wherein said shift register means is a 4-bit shift register.

9. The device of claim 5 wherein:

a. said first electrical means includes also first buffer amplifier means operatively connected between the first electrode of said first capacitor means and the first input of said first amplifier means; and b. said second electrical means includes also second buffer amplifier means operatively connected between the first electrode of said first capacitor means and the first input of said first amplifier means.

10. A device for conversion of analog data to digital form, said device comprising:

a. input terminal means for receiving a bipolar analog signal;

b. reference source means for providing at least first and second reference signals;

c. first amplifier means having at least a pair of inputs and at least one output, a first of said pair being operatively connected to said input terminal means and a second of said pair being operatively connected to said reference source means;

d. second amplifier means having at least a pair of inputs and at least one output, a first of said pair being operatively connected to the first input of said first amplifier means, a second of said pair being operatively connected to said reference source means, and said output being operatively connected to the output of said first amplifier means;

e. first capacitor means, having at least first and second electrodes for storing an output signal from said first and second amplifier means and for providing an input signal to the first inputs of said first and second amplifier means, said second electrode being connected to ground potential;

f. second capacitor means, having at least first and second electrodes for, storing an output signal from said first and second amplifier means and for providing an input signal to the first input of said first and second amplifier means, said second electrode being connected to ground potential;

g. first switch means for connecting the first electrode of said first capacitor to the first input and output of said first amplifier means and the first input and output of said second amplifier means;

h. second switch means for connecting the first electrode of said second capacitor to the first input and output of said first amplifier means and the first input and output of said second amplifier means;

i. third switch means for disconnecting the second input of said first amplifier means from said reference source means;

j. controller means for actuating said first, second and third switch means, the first electrode of said first capacitor means is connected to the first input of said first amplifier means when the first electrode of said second capacitor means is connected to the output of said amplifier means, the first electrode of said second capacitor means is connected to the first input of said first amplifier means when the first electrode of said first capacitor means is connected to the output of said first amplifier means, the first electrode of said first capacitor means is connected to the first input of said second amplifier means when the first electrode of said second capacitor means is connected to the output of said second amplifier means, and the first electrode of said second capacitor means is connected to the first input of said second amplifier means when the first electrode of said first capacitor means is connected to the output of said second amplifier means;

k. fourth switch means for connecting said first and second reference signals to said third switch means and the second input of said second amplifier means;

l. control flip-flop means for actuating said fourth switch means, said first reference signal is applied to the second input of said first and second amplifier means when the output signal from said first amplifier means is positive and said second reference signal is applied to the second input of said first and second amplifier means when the output signal from said first amplifier means is negative;

m. comparator means operatively connected to the output of said first amplifier means, the output signals from said comparator means being a function of the polarity of the signal as at the output of said first amplifier means;

n. polarity means operatively connected to said comparator means and controller means for specifying the polarity of the input analog signal;

o. 4-bit shift register means for recording said comparator output signals;

p. decoder means for decoding said comparator output signals recorded in said 4-bit shift register means; and q. display means for receiving the decoded signals from said decoder and for presenting the input analog signal in binary coded decimal form.

11. The device of claim 10 wherein said display means includes a plurality of numerical indication means and said input analog signal is presented in numerical form by said display means.

12. The device of claim 10 wherein said digital form is binary coded decimal.

13. A device for conversion of analog data to digital form, said device comprising:

a. input terminal means for receiving a bipolar analog signal;

b. reference terminal means for receiving a reference signal;

c. amplifying means including an amplifier means having at least one input and one output;

d. first electrical means including first capacitor means having at least first and second electrodes for storing an output signal from said amplifier means and for providing an input signal to said amplifier means;

e. second electrical means including second capacitor means having at least first and second electrodes for storing an signal from said amplifier means and for providing an input signal to said amplifier means;

f. first switch means for connecting the first electrode of said first capacitor means to the input and output of said amplifier means;

g. second switch means for connecting the first electrode of said second capacitor means to the input and output of said amplifier means;

h. third switch means for sequentially connecting said reference signal and ground potential to the second electrode of said first capacitor means, the sequence of connecting said reference signal and ground potential is specified by the polarity of the signal as at the output of said amplifier means;

i. fourth switch means for sequentially connecting said reference signal and ground potential to the second electrode of said second capacitor means, the sequence of connecting said reference signal and ground potential is specified by the polarity of the signal as at the output of said amplifier means;

j. controller means for actuating said first, second, third, and fourth switch means, the first electrode of said first capacitor means is connected to the input of said amplifier means when the first electrode of said second capacitor means is connected to the output of said amplifier means and the first electrode of said second capacitor means is connected to the input of said amplifier means when the first electrode of said first capacitor means is connected to the output of said amplifier means;

k. comparator means operatively connected to the output of said amplifier means, the output from said comparator means being a function of the polarity of the signal as at the output of said amplifier means; and l. third electrical means including register means for recording said comparator output signals, whereby said comparator output signals represent the input analog signal in digital form.

14. The device of claim 13 wherein:

a. said first electrical means includes also first buffer amplifier means operatively connected between the first electrode of said first capacitor means and the first input of said amplifier means; an b. said second electrical means includes also second buffer amplifier means operatively connected between the first electrode of said second capacitor means and the first input of said amplifier means.

15. The device of claim 13 wherein said amplifying means includes also:

a. first resistor means serially connected between the second input and output of said amplifier means; and b. second resistor means operatively connected between the second input of said amplifier means and said reference source means.

16. The device of claim 13 wherein said third electrical means includes display means for receiving a signal from said register means, whereby the input analog signal is presented in digital form by said display means.

17. A device for conversion of analog data to digital form, said device comprising:

a. input terminal means for receiving a bipolar analog signal;

b. reference terminal means for receiving a reference signal;

c. first amplifier means having at least one input and one output;

d. second amplifier means having at least one input and one output;

e. first capacitor means having at least first and second electrodes for storing an output signal from said first and second amplifier means and for providing an input signal to said first and second amplifier means;

f. second capacitor means having at least first and second electrodes for storing an output signal from said first and second amplifier means and for providing an input signal to said first and second amplifier means;

g. first switch means for connecting the first electrode of said first capacitor to the input of said first amplifier means and to the output of said first and second amplifier means;

h. second switch means for connecting the first electrode of said second capacitor to the input of said first amplifier means and to the output of said first and second amplifier means;

i. third switch means for connecting the output of said first amplifier means to the input of said second amplifier means;

j. fourth switch means for sequentially connecting said reference signal and ground potential to the second electrode of said first capacitor means, the sequence of connecting said reference signal and ground potential is specified by the polarity of the signal as at the output of said first amplifier means;

k. fifth switch means for sequentially connecting said reference signal and ground potential to the second electrode of said second capacitor means, the sequence of connecting said reference signal and ground potential is specified by the polarity of the signal as at the output of said first amplifier means;

l. controller means for actuating said first, second, third, fourth, and fifth switch means;

m. first electrical means including comparator means operatively connected to the output of said first amplifier means, the output signals from said comparator means being a function of the polarity of the signal as at the output of said first amplifier means;

n. shift register means for recording said comparator output signals;

o. decoder means for decoding said comparator output signals recorded in said shift register means; and p. display means for receiving the decoded signals from said decoder and for presenting the input analog signal in digital form.

18. The device of claim 17 wherein said first electrical means includes also polarity means operatively connected to said comparator means and controller means for specifying the polarity of the input analog signal.

19. The device of claim 17 wherein said display means includes a plurality of numerical indicator means and said input analog signal is presented in numerical form by said display means.

20. The device of claim 17 wherein said shift register means is a 4-bit shift register.

21. A device for conversion of analog data to digital form, said device comprising:

a. input terminal means for receiving a bipolar analog signal;

b. reference terminal means for receiving a reference signal;

c. first amplifier means having at least one input and one output;

d. second amplifier means having at least one input and one output;

e. first capacitor means having at least first and second electrodes for storing an output signal from said first and second amplifier means and for providing an input signal to said first and second amplifier means;

f. second capacitor means having at least first and second electrodes for storing an output signal from said first and second amplifier means and for providing an input signal to said first and second amplifier means;

g. first switch means for connecting the first electrode of said first capacitor to the input of said first amplifier means and to the output of said first and second amplifier means;

h. second switch means for connecting the first electrode of said second capacitor to the input of said first amplifier means and to the output of said first and second amplifier means;

i. third switch means for connecting the output of said first amplifier means to the input of said second amplifier means;

j. fourth switch means for sequentially connecting said reference signal and ground potential to the second electrode of said first capacitor means, the sequence of connecting said reference signal and ground potential is specified by the polarity of the signal as at the output of said first amplifier means;

k. fifth switch means for sequentially connecting said reference signal and ground potential to the second electrode of said second capacitor means, the sequence of connecting said reference signal and ground potential is specified by the polarity of the signal as at the output of said first amplifier means;

l. controller means for actuating said first, second, third, fourth, and fifth switch means;

m. comparator means operatively connected to the output of said first amplifier means, the output signal from said comparator means being a function of the polarity of the signal as at the output of said first amplifier means;

n. polarity means operatively connected to said comparator means and controller means for specifying the polarity of the input analog signal;

o. 4-bit shift register means for recording said comparator output signals;

p. decoder means for decoding said comparator output signals recorded in said 4-bit shift register means; and q. display means for receiving the decoded signals from said decoder and for presenting the input analog signal in digital form.

22. The device of claim 21 wherein said display means includes a plurality of numerical indicator means and said input signal is presented in numerical form by said display means.

23. The device of claim 21 wherein said digital form is binary coded decimal.